US 9,582,458 B2

(12) United States Patent
Gavish et al.

(10) Patent No.: US 9,582,458 B2
(45) Date of Patent: Feb. 28, 2017

(54) GENERATION OF A RANDOM SUB-SPACE OF THE SPACE OF ASSIGNMENTS FOR A SET OF GENERATIVE ATTRIBUTES FOR VERIFICATION COVERAGE CLOSURE

(71) Applicant: CADENCE DESIGN SYSTEMS, INC., San Jose, CA (US)

(72) Inventors: Efrat Gavish, Tel Aviv (IL); Yael Kinderman, Givat-Shmuel (IL); Meirav O. Nitzan, Sunnyvale, CA (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 1078 days.

(21) Appl. No.: 13/718,093

(22) Filed: Dec. 18, 2012

(65) Prior Publication Data
US 2014/0172347 A1    Jun. 19, 2014

(51) Int. Cl.
| G06F 3/01 | (2006.01) |
| G06F 15/00 | (2006.01) |
| G06F 17/50 | (2006.01) |
| G06F 11/36 | (2006.01) |
| G01R 31/3183 | (2006.01) |

(52) U.S. Cl.
CPC ..... *G06F 15/00* (2013.01); *G01R 31/318314* (2013.01); *G06F 11/3684* (2013.01); *G06F 17/5022* (2013.01); *G06F 17/5081* (2013.01)

(58) Field of Classification Search
CPC .. G06F 15/00; G06F 17/5081; G06F 11/3684; G06F 11/3676; G06F 17/5022; G06F 11/263; G06F 11/3688; G06F 17/504; G01R 31/31835; G01R 31/3181
See application file for complete search history.

(56) References Cited

U.S. PATENT DOCUMENTS

| 2004/0199887 A1* | 10/2004 | Jain ........................ G06F 17/504 716/106 |
| 2004/0249618 A1* | 12/2004 | Fine ........................ G06F 11/261 703/2 |
| 2008/0177968 A1* | 7/2008 | Emek ........................ G06F 17/5022 711/170 |
| 2008/0195982 A1* | 8/2008 | Nahir ........................ G06F 17/5022 716/106 |
| 2009/0204591 A1* | 8/2009 | Kaksonen ........... G06F 11/3684 |

(Continued)

OTHER PUBLICATIONS

Platzner et al.,Design and Implementation of a Parallel Constraint Satisfaction Algorithm,Aug. 1996,pp. 1-19.*

*Primary Examiner* — John Breene
*Assistant Examiner* — Mohammad Islam
(74) *Attorney, Agent, or Firm* — Pearl Cohen Zedek; Latzer Baratz LLP

(57) ABSTRACT

System, method and computer readable medium are described. The method may include obtaining user defined distribution traits characterizing a random sub-space of a space of assignments for a set of generative variables. The method may further include applying the user defined distribution traits on the space of assignments for a set of generative variables to generate the random sub-space of the space of assignments for a set of generative variables. The method may also include testing a device under test using the generated random sub-space of the space of assignments for a set of generative variables.

20 Claims, 4 Drawing Sheets

(56) References Cited

U.S. PATENT DOCUMENTS

| | | | | |
|---|---|---|---|---|
| 2009/0282307 A1* | 11/2009 | Chaturvedula | G01R 31/318314 | 714/738 |
| 2013/0298102 A1* | 11/2013 | Kadkade | G06F 17/50 | 716/136 |
| 2014/0013290 A1* | 1/2014 | Lyons, Jr. | G06F 17/5045 | 716/106 |
| 2014/0173349 A1* | 6/2014 | Farchi | G06F 11/3684 | 714/37 |

* cited by examiner

GENERATION OF A RANDOM SUB-SPACE OF THE SPACE OF ASSIGNMENTS FOR A SET OF GENERATIVE ATTRIBUTES FOR VERIFICATION COVERAGE CLOSURE

FIELD OF THE INVENTION

The present invention relates to design verification, and more particularly to methods and systems for generation of a random sub-space of the space of assignments for a set of generative attributes for verification coverage closure.

BACKGROUND

Design verification is a common process for testing an integrated circuit, board, or system-level architecture, to confirm it complies with the requirements defined by the specification of the architecture for that device. Design verification for a device under test (DUT) may be performed on the actual device, or on a simulation model of the device.

Verifying a design using a simulation model of the device involves using hardware description languages (HDL) such as Verilog and VHDL. These languages are designed to describe hardware at high levels of abstraction. The generated simulated model of the tested device can receive input stimuli in the form of test vectors, which are a string of binary values applied to the input of a circuit. The simulated model then produces results, which are checked against the expected results for the particular design of the device.

However, HDLs are not designed for actual verification. Therefore, the verification engineer has to write additional programming code in order to interface with the models described by these hardware description languages in order to perform design verification of the device.

When verifying an actual, manufactured device (or a similar device implemented in a fast technology such as a field programmable gate array (FPGA)), there is still a need to inject input stimuli, similar to the stimuli used for verifying a simulation.

SUMMARY OF THE INVENTION

There is thus provided, in accordance with embodiments of the present invention, a method performed by a processor. The method may include obtaining user defined distribution traits characterizing a random sub-space of a space of assignments for a set of generative variables. The method may further include applying the user defined distribution traits on the space of assignments for a set of generative variables to generate the random sub-space of the space of assignments for a set of generative variables. The method may also include testing a device under test using the generated random sub-space of the space of assignments for a set of generative variables.

In some method embodiments, the user defined distribution traits comprise general user defined distribution traits and specific user defined distribution traits.

In some method embodiments the general user defined distribution traits comprise generative attributes, constraints associated with these generative attributes and relations.

According to some method embodiments of the present invention, the specific user defined distribution traits comprise constraints and sub-groups of generative attributes for exhaustive execution.

Further, in accordance with some method embodiments, the method may include obtaining the specific user defined distribution traits for a regression.

In some embodiments, the steps of obtaining the user defined distribution traits and applying the user defined distribution traits on the space of assignments for a set of generative variables to generate the random sub-space of the space of assignments for a set of generative variables are performed as pre-test steps.

In some embodiments, there is provided a system. The system may include a generator. The generator may be configured to obtain user defined distribution traits characterizing a random sub-space of a space of assignments for a set of generative variables. The generator may also be configured to apply the user defined distribution traits on the space of assignments for a set of generative variables to generate the random sub-space of the space of assignments for a set of generative variables.

According to some system embodiments, the user defined distribution traits comprise general user defined distribution traits and specific user defined distribution traits.

According to some system embodiments the general user defined distribution traits comprise generative attributes, constraints associated with these generative attributes, and relations.

In some system embodiments the specific user defined distribution traits comprise constraints and sub-groups of generative attributes for exhaustive execution.

In accordance with some system embodiments the generator is further configured to obtain the specific user defined distribution traits for a regression.

There is further provided, in accordance with some embodiments of the present invention, a non-transitory computer readable medium having instructions stored thereon, which when executed by a processor cause the processor to perform the method of obtaining user defined distribution traits characterizing a random sub-space of a space of assignments for a set of generative variables, applying the user defined distribution traits on the space of assignments for a set of generative variables to generate the random sub-space of the space of assignments for a set of generative variables; and testing a device under test using the generated random sub-space of the space of assignments for a set of generative variables.

In some embodiments of the non-transitory computer readable medium the user defined distribution traits comprise general user defined distribution traits and specific user defined distribution traits.

In some embodiments of the non-transitory computer readable medium the general user defined distribution traits comprise generative attributes, constraints associated with these generative attributes and relations.

In some embodiments of the non-transitory computer readable medium the specific user defined distribution traits comprise constraints and sub-groups of generative attributes for exhaustive execution.

In some embodiments of the non-transitory computer readable medium further includes instructions that when executed by the processor cause the processor to obtain the specific user defined distribution traits for a regression.

In some embodiments of the non-transitory computer readable medium the user defined distribution traits comprise one or more sets of attributes for exhaustive testing.

In some embodiments of the non-transitory computer readable medium the user defined distribution traits comprise one or more sets of attributes for non-exhaustive testing.

In some embodiments of the non-transitory computer readable medium the user defined distribution traits comprise a repetition rule.

DETAILED DESCRIPTION

Figure 1:
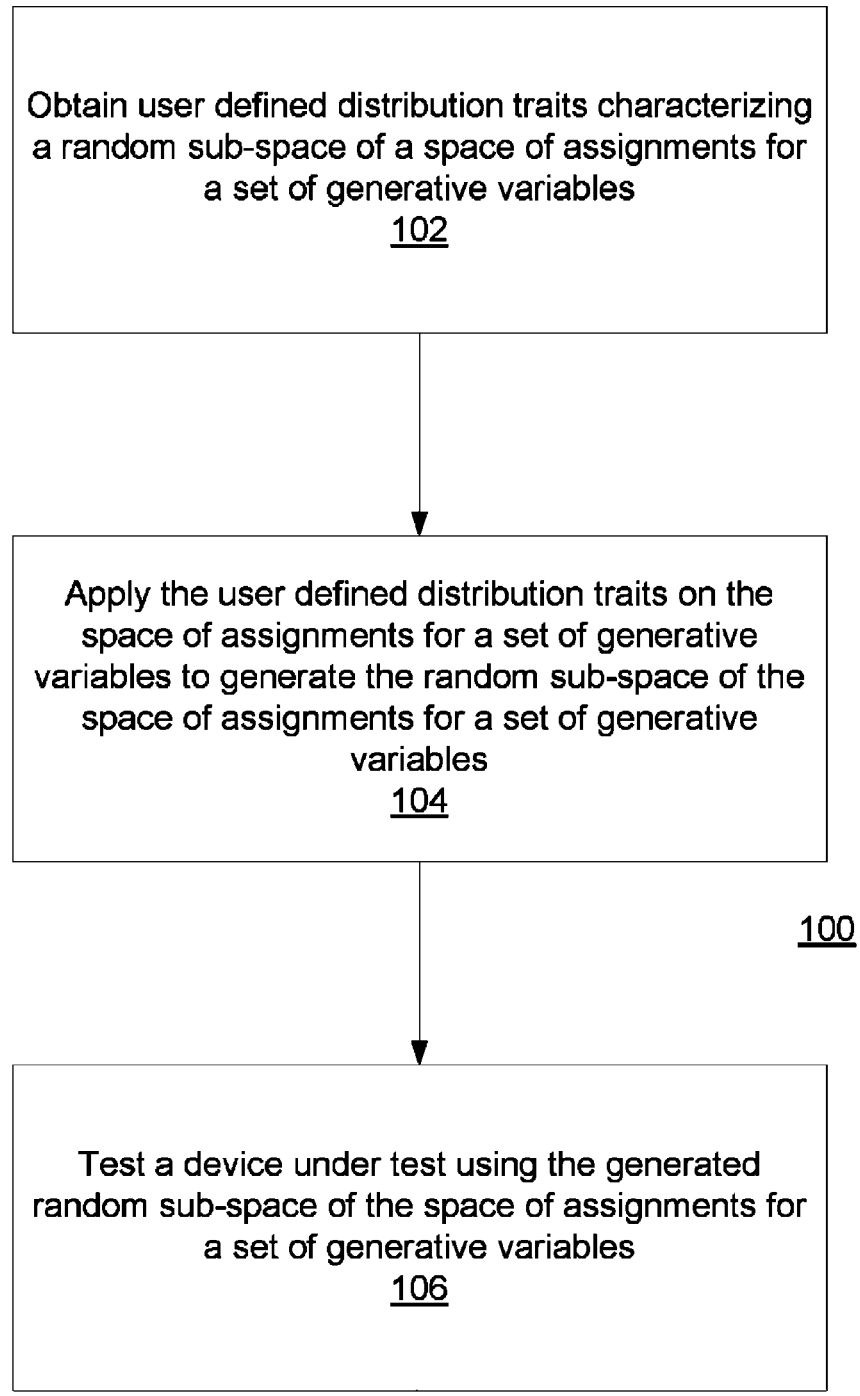
FIG. 1 illustrates a method 100 for test generation involving generating a random sub-space of assignments of interest for a set of generative variables, according to embodiments of the present invention.

In the following detailed description, numerous specific details are set forth in order to provide a thorough understanding of the methods and apparatus. However, it will be understood by those skilled in the art that the present methods and apparatus may be practiced without these specific details. In other instances, well-known methods, procedures, and components have not been described in detail so as not to obscure the present methods and apparatus.

Although the examples disclosed and discussed herein are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method examples described herein are not constrained to a particular order or sequence. Additionally, some of the described method examples or elements thereof can occur or be performed at the same point in time.

Unless specifically stated otherwise, as apparent from the following discussions, it is appreciated that throughout the specification, discussions utilizing terms such as "adding", "associating" "selecting," "evaluating," "processing," "computing," "calculating," "determining," "designating," "allocating" or the like, refer to the actions and/or processes of a computer, computer processor or computing system, or similar electronic computing device, that manipulate, execute and/or transform data represented as physical, such as electronic, quantities within the computing system's registers and/or memories into other data similarly represented as physical quantities within the computing system's memories, registers or other such information storage, transmission or display devices.

According to embodiments of the present invention, methods and systems for test generation involving generating a random sub-space of a space of assignments for a set of generative variables are disclosed herein.

Such a method may include obtaining user defined distribution traits characterizing the random sub-space of the space of assignments for a set of generative variables. The method may further include applying the user defined distribution traits on the space of assignments for a set of generative variables to generate the random sub-space of the space of assignments for a set of generative variables. The method may also include testing a device under test using the generated random sub-space of the space of assignments for a set of generative variables.

An aspect of embodiments of the present invention relates to the provision of a novel construct, which facilitates addressing to user-defined distribution traits in the generation of a sub-space of assignments for a set of generative variables. By referring to user defined distribution traits, better coverage may be obtained, as the tester may direct the test of the DUT to concentrate on or handle with extra attention features that are specific for that design.

A method for test generation involving generating a random sub-space of a space of assignments for a set of generative variables, which according to embodiments of the present invention may be implemented as a pre-test step or be embedded in the verification testbench. Based on a-priori knowledge of the design and planned use of a DUT, a tester may analyze that design and identify groups of generative attributes (e.g. parameters) which are of particular interest and need all or most of their permutations tested, and cause the test to be focused on these groups. Furthermore, a tester may further identify sub-groups of the above-mentioned identified groups, which the tester may consider to be "interesting" for the test (e.g., a sub-group of generative attributes that may validate a certain feature of the DUT, a sub-group of generative attributes for running a nightly regression, a sub-group of generative attributes for sanity testing, a sub-group of generative attributes for code checking gating, etc.).

Other groups of generative attributes may be ignored or given lower weight, and thus only some (not all) permutations would be used for the testing of that particular DUT.

Examples described hereinafter relate to implementing a method in accordance with embodiments of the present invention in a pre-test step, while other examples are described which are implemented within the verification testbench.

Design IPs (Intellectual Property) in the Field-Programmable Gate Array (FPGA) world, as well as in general, are characterized by a set of design attributes, or parameters, which affect the way the design behaves. For example: if the design IP is that of a RAM, then the WRITE_MODE could determine how data is stored in the RAM, and whether or not the data output of the RAM reflects the input data.

In order to validly verify a device under test (DUT), it is desired to test the DUT with combinations of parameter values, sometimes exhaustively. For example, typically, all major design modes are tested with all possible data-width values.

When using Open Verification Methodology (OVM) or Universal Methodology Verification (UVM) environments, these environments themselves may often become parameterized as well. For example—if the data bus width of the DUT is varying, it will cause the DUT interface to become parameterized, and hence the monitor, driver and other such components may become parameterized as well.

The simple solution to providing high quality IP in the verification challenge of a DUT would be to create an exhaustive set of permutations for all parameters, and fully verify the DUT with each permutation. However, doing so has its disadvantages. Using an exhaustive set of permutations for all parameters and fully verifying the DUT with each permutation is not scalable. For example, for a DUT with 20-30 parameters, each having 2 to 10 values, the exhaustive permutation set could reach hundreds of thousands of permutations, or even more.

Furthermore, this exhaustive approach is likely to involve extensive simulation time that poses a heavy burden on available computing resources. Moreover, covering all permutations for more complex designs may not be feasible at all.

The efficiency of using an exhaustive set of permutations for all parameters is indeed questionable, as the turnaround time for running a regression is too long when doing so.

In terms of functionally, there seems to be no or little justification to cross all values of all parameters with each other.

There are cases where some of the parameters are considered more important to test in order to determine proper functionality of a DUT, whereas other parameters are not that important. In some cases it is desired to repeat certain parameters, whereas repeating other parameters is not that important (and therefore unnecessary).

Typically, the motivation in design verification is to test the DUT using parameter sets that test versatile functionalities of the DUT, while minimizing the number of these parameter sets used in the test.

It is desired, when considering a sound solution for covering an interesting sub-space of the space of assignments for a set of generative attributes, to obtain control over the distribution of the generated attributes. For example, it is desirable to avoid repetitions of parameters assignment sets, since each parameter set specifies a design configuration of a test suite execution. Furthermore, it is also desired to have proper coverage of the parameters space. Embodiments of the present invention offer these qualities.

In some embodiments a pre-test step may be desired, in which the parameter sets are generated efficiently and provided to the testbench; in other embodiments the generator of the sub-space of the space of assignments for a set of generative attributes may be embedded in the verification testbench.

In some embodiments the sub-space of generative attributes may be automatically and randomly generated, considering all parameters, legal values and constraints, as well as dependencies between parameters.

Solutions according to embodiments of the present invention demonstrate flexibility in generating either a full set of generative attributes, or smaller subsets of generative attributes, depending on specific verification needs (e.g., running a complete design verification as opposed to the execution of a nightly regression, etc.).

In some embodiments simple randomization may not be good enough. For example, some verification environments are OVM/UVM based, and in such cases the design parameters and their constraints can be defined in one configuration class. The parameters are defined as generative attributes (or variables), with constraints and implied constraints describing valid parameter values and how they affect each other.

Potentially, it could be enough to simply randomize this configuration class separately as a pre-test step, and thus create legal parameters sets. A coverage group defined in the class could indicate how much of the parameter space has been covered so far. Such a solution would satisfy quite a few requirements: it is a pre-test step and an automated random generation of the parameters set. The coverage group defined in the class satisfies the last requirement, for proper coverage of the parameters space.

Experience shows, however, that this solution does not satisfy the remaining two requirements: control over distribution, and flexibility to define which parameter combinations to exhaustively generate.

According to embodiments of the present invention a system and method for test generation involving generating a random sub-space of assignments of interest for a set of generative variables, in particular suited for testing a DUT (device under test) are provided.

According to embodiments of the present invention it is proposed to use a defined language to select a random sub-space of assignments that satisfies constraints of interest.

FIG. 1 illustrates a method 100 for generating a random interesting sub-space of a space of assignments for a set of generative variables, according to embodiments of the present invention. Method 100 may include obtaining 102 user defined distribution traits characterizing a random sub-space of a space of assignments for a set of generative variables. The method may also include applying 104 the user defined distribution traits on the space of assignments for a set of generative variables to generate the random sub-space of the space of assignments for a set of generative variables. The method may further include testing 106 a device under test using the generated random sub-space of the space of assignments for a set of generative variables.

The generation of a random interesting sub-space of a space of assignments for a set of generative variables, according to embodiments of the present invention is a pre-test step. A methodological approach to the design parameters analysis is used to enhance the generation of a random interesting sub-space of a space of assignments for a set of generative variables, according to embodiments of the present invention.

In some embodiments of the present invention a basic capability in the e language, which does not exist in SystemVerilog, is used as the basis for a solution. A methodological approach may be considered, in which the DUT may be analyzed and the groups of "interesting" parameters which need to have all their permutations tested may be identified. For example, all data width values can be tested with all write modes, and all date width values can be tested with all read modes. However, it is not necessary to test all read modes with all write modes.

Further, sub-groups of the complete list of "interesting" parameter groups mentioned hereinabove may be identified for various purposes, e.g., a sub-group that validates a certain feature; a sub-group for nightly regression; a sub-group for sanity testing or for code check-in gating; etc.

Once these parameter relationships have been established, a technical solution that generates random/exhaustive sets of values may be employed.

In accordance with some embodiments of the present invention, it is noted that the e language may be used to provide a good solution. Besides having the capability to generate random constrained values, it has the capability of exhaustively generating all valid values of certain fields in a class, while randomizing the others.

For example, consider the following e struct:

```
struct foo{
    width: uint [1, 2, 4, 8, 16];
    mode: uint (bits:2);
    init_val: uint(bits:16);
    keep (mode == 0|| width ==16) => (init_val ==0);
}
```

Using the e function all_iterations( ) a user may query for a set of foo objects that include all valid combinations of {width, mode} (set size would then be (4*5)=20 objects), and in each one of these objects, the init_val field will have a random value that applies to the constraint keep (mode==0|| width==16)=>(init_val==0).

The e features described above almost fully satisfy the solution requirements according to embodiments of the present invention. However, in a real-life case of design parameter sets, there may be more than one group of parameters (such as {width, mode}) that needs to be exhaustively generated. Creating different lists for different parameter groups can solve that requirement, but this approach would result in a lot of duplications in those parameters between the lists.

Therefore, a new generation construct is introduced herein, according to embodiments of the present invention. The new generation construct allows defining various user-defined specific distribution traits.

Figure 2A:
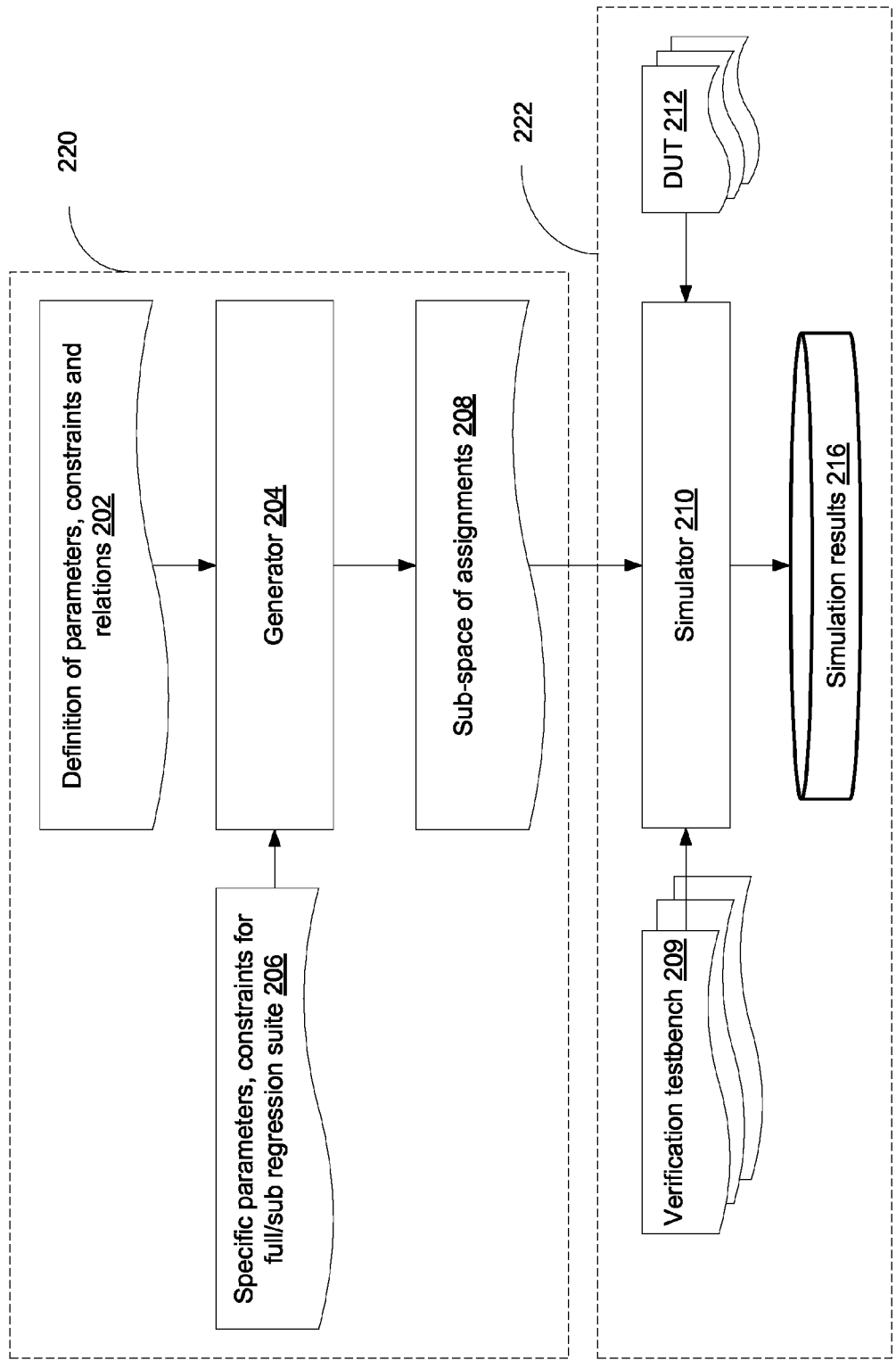
FIG. 2A illustrates a generation engine 220 for generating a random interesting sub-space of a space of assignments for a set of generative variables implemented as a pre-test step, according to embodiments of the present invention.

FIG. 2A illustrates a generation engine 220 for generating a random interesting sub-space of a space of assignments for a set of generative variables implemented as a pre-test step, according to embodiments of the present invention.

According to embodiments a generation engine is used, wherein the inputs to the generation engine may include the following:

a) a definition 202 of general distribution traits, e.g., design parameters, constraints associated with these design parameters and relations 202. According to embodiments this may be input once for each design.

b) a definition of specific distributions traits—e.g., an ini format file that defines more constraints and sub-groups of parameters 206 for exhaustive execution with respect to each other. According to embodiments of the present invention this may be input for every regression ("regression"—any regression or a sub-regression). According to embodiments various regression runs may be planned, e.g., a nightly run, full run, specific feature testing run, etc. A careful consideration of the necessary parameters combinations may be required, in order to avoid huge numbers of permutations sets.

The input files described above may be processed by the generator 204, according to embodiments of the present invention, in the following way: The ini file input may be translated to further constraints expanding the original e struct, relying on e's Aspect Oriented Programming capability—extensions of structs with added constraints (similar to SystemVerilog class inheritance with added constraints); The specification of the parameters groups to be exhaustively generated may be translated to a macro call.

User-defined specific distribution traits may include, for example:

a) Exhaustive rules: The generation engine may be configured to receive a user-specified set or user-specified sets of attributes $(x_1, \ldots x_k)$ indicated by the user as necessary for exhaustive testing, i.e., any generated sub-space of assignments associated with this set or sets of attributes $(x_1, \ldots x_k)$ thus has to include all possible permutations of $(x_1, \ldots x_k)$.

b) Non-Exhaustive rules: The generation engine may be configured to receive a user-specified set or user-specified sets of attributes $(y_1, \ldots y_m)$ indicated by the user for non-exhaustive testing, i.e., any generated sub-space of assignments associated with that user-specified set or user-specified sets of attributes is to exclude permutations repeating the same value of $y_i$ (for i in the range [1-m]).

c) Repetition rule: The generation engine may be configured to receive a repetition count to determine how many times each permutation of the exhaustive set of parameters should appear in the generated sub-space of assignments. In some embodiments the repetition count may be set, by default, to be 1. In other embodiments, the user may define the size of the generated parameter set by setting the repetition counter to any other desired number.

When the new generation construct (e.g., as a macro) is used, in accordance with embodiments of the present invention, the generation engine 220 may generate exhaustive/random parameters sets, complying with the rules above in an efficient manner.

Generation engine 220 receives the original parameters struct, along with the information above, and in accordance with embodiments of the present invention may then generate a sub-space 208 of a space of assignments for a set of generative variables. This may be provided in the form of sets of parameters which may be written to output files.

Simulation engine 222 may include simulator 210, and may receive the sub-space of assignments and run simulations on each DUT 212. Simulation results may be stored in database 216 for review and reference.

The following example demonstrates the use of a method for test generation involving generating a random sub-space of assignments of interest for a set of generative variables according to embodiments of the present invention.

A Dual Port RAM IP has typically 12 major parameters that define its logical behavior, and a few other parameters such as initial memory value or reset value. The total number of possible permutations of the major parameters reaches 180,000, which means running a full test suite on each set, using a week-long regression time. A revised verification plan using a method for test generation involving generating a random sub-space of assignments of interest for a set of generative variables according to embodiments of the present invention yielded a much smaller sub-space of permutations of parameters sets, and thus reduced the total number of resulting parameters sets.

Examples of some sub-regression definitions may include:
Port A: READ_WIDTH is 18 or 36, WRITE_WIDTH is 18 or 36
Port B: READ_WIDTH is 18 or 36, WRITE_WIDTH is 18 or 36
Exercise ALL combinations of:
READ_WIDTH_A×READ_WIDTH_B (2*2=4), WRITE_WIDTH_A×WRITE_WIDTH_B (2*2=4)

Comparing the results of the proposed solution with a simple SystemVerilog (SV) test generation resulted in a finding that running a simulator with SV constrained random generator required 7 to 26 randomization calls to satisfy the sub-regression definitions, and hence yielded 7 to 26 permutations of the parameters sets, whereas running a test generation using the proposed solution yielded between 4 and 6 permutations of the parameters sets. The first 4 sets were the minimum required to satisfy the first exhaustive set—READ_WIDTH_A×READ_WIDTH_B, but since some combinations of the other exhaustive set (WRITE_WIDTH_A×WRITE_WIDTH_B) were also exercised, the engine only had to add the non-exercised permutations of that set.

A solution according to embodiments of the present invention first exhaustively generates the first specified group, READ_WIDTH_A×READ_WIDTH_B, while simply randomizing the other parameters, and hence creating 4 parameter sets for the entire parameters set. Then, it refers to the other specified exhaustive group, WRITE_WIDTH_A×WRITE_WIDTH_B. Now, since some combinations of the second exhaustive group were already exercised when handling the first group, the engine only adds the non-exercised permutations of that group. The SV solution, on the other hand, randomizes all parameters in a BRAM_config_class call (a call in a SV verification plan compared with the present solution) with no special attention to the combinations we would like to see exhaustively exercised, since randomization does not consider coverage description. Hence, reaching the desired combinations could take a greatly varying number of tests.

Using the generated sub-space of permutations of the parameter sets avoids the need to run the whole test suite 12 more times.

Figure 2B:
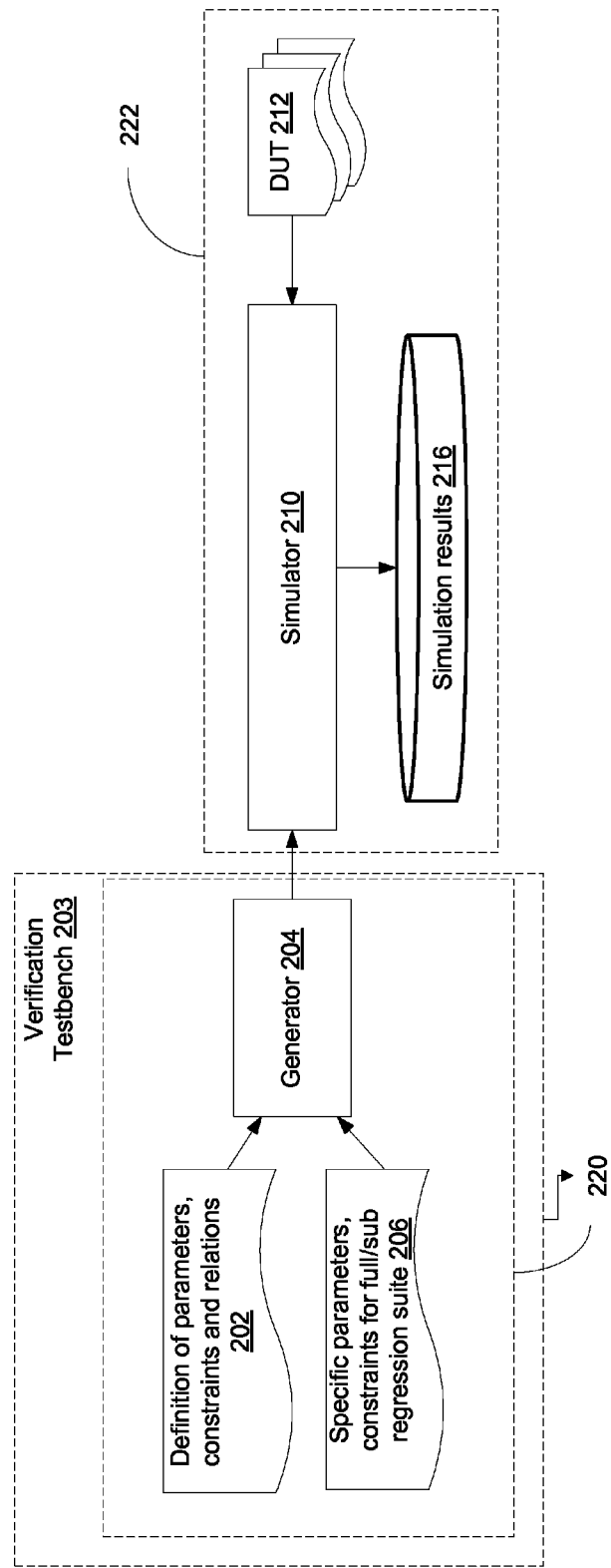
FIG. 2B illustrates a generation engine 220 for generating a random interesting sub-space of a space of assignments for a set of generative variables implemented integrally with the test bench, according to embodiments of the present invention.

FIG. 2B illustrates an alternative generation engine 220 for generating a random interesting sub-space of a space of assignments for a set of generative variables implemented integrally with the test bench, according to embodiments of the present invention. Here the generation of random sub-space of a space of assignments for a set of generative variables is integrated in the testbench.

Figure 3:
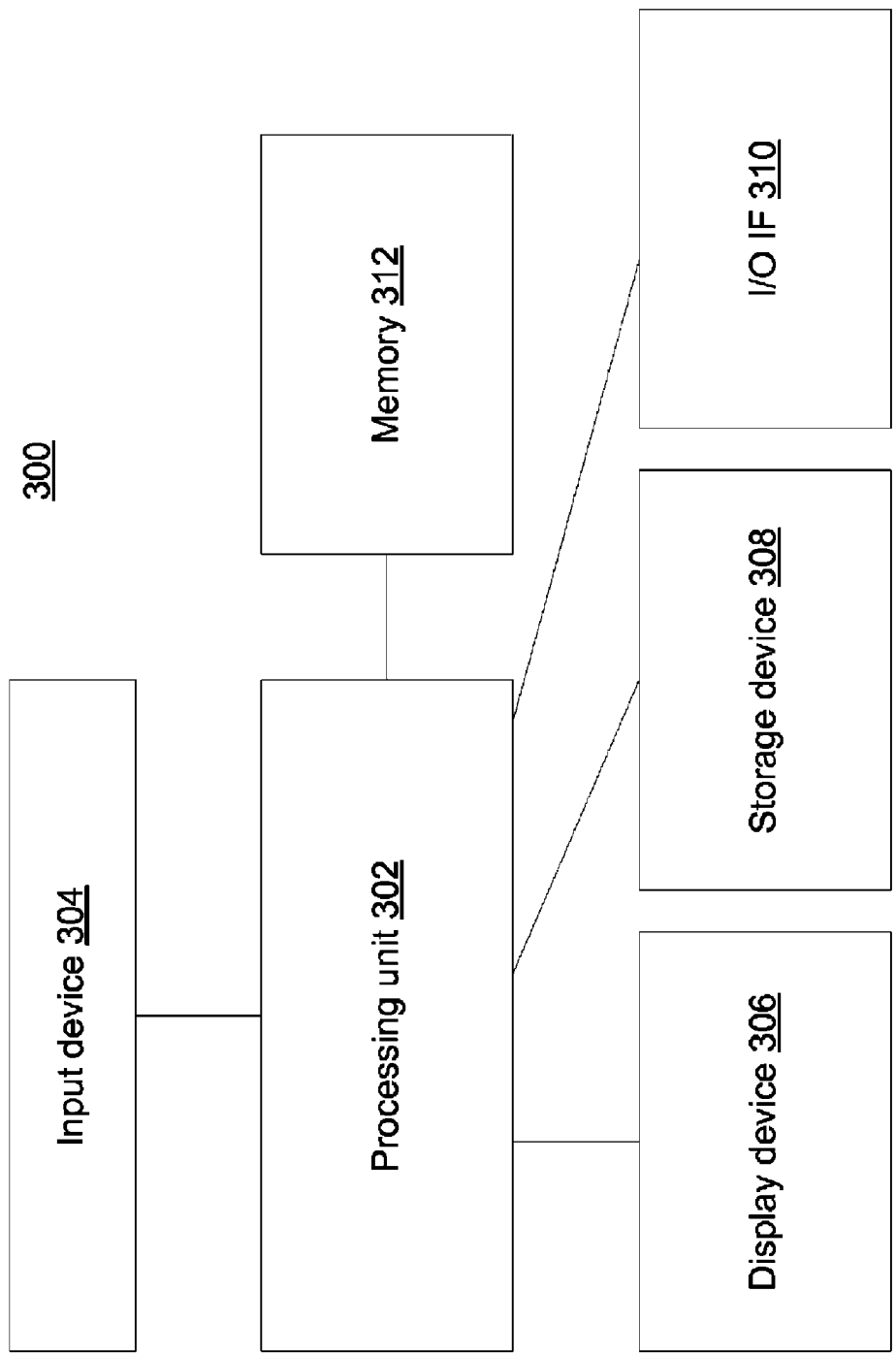
FIG. 3 illustrates a system for test generation involving generating a random sub-space of a space of assignments for a set of generative variables, according to embodiments of the present invention.

FIG. 3 illustrates a system 300 for test generation involving generating a random sub-space of a space of assignments for a set of generative variables, according to embodiments of the present invention.

System 300 may include a processing unit 302, including one or more processors, in one or a plurality of computing devices, either locally or distributed in a plurality of locations. System 300 may also include input device 304, such as, for example, a keyboard, pointing device, touch sensitive screen etc., or an input interface for receiving input such as an input file or input string, which may be used in obtaining user defined distribution traits characterizing the random sub-space of the space of assignments for a set of generative variables, in accordance with embodiments of the present invention.

System 300 may further include memory 312 for storing information (e.g., a file containing the generated sub-space of the space of assignments for a set of generative variables) for quick access by processing unit 302. Memory 312 may include Random Access Memory (RAM), Dynamic Random Access Memory (DRAM), cache memory, flash memory, etc. Storage device 306 may be provided, for storing computer executable programs and information on storage medium, such as, for example, hard-disk drive, optical disk drive, and other non-transitory memory storage devices. Input/Output (I/O) Interface (IF) 310 may be provided to interface the system with other devices.

Examples may be embodied in the form of a system, a method or a computer program product. Similarly, examples may be embodied as hardware, software or a combination of both. Examples may be embodied as a computer program product saved on one or more non-transitory computer readable medium (or mediums) in the form of computer readable program code embodied thereon. Such non-transitory computer readable medium may include instructions that when executed cause a processor to execute method steps in accordance with examples. In some examples the instructions stores on the computer readable medium may be in the form of an installed application and in the form of an installation package.

Such instructions may be for example loaded into one or more processors and executed.

For example, the computer readable medium may be a non-transitory computer readable storage medium. A non-transitory computer readable storage medium may be, for example, an electronic, optical, magnetic, electromagnetic, infrared, or semiconductor system, apparatus, or device, or any combination thereof.

Computer program code may be written in any suitable programming language. The program code may execute on a single computer, or on a plurality of computers.

Examples are described hereinabove with reference to flowcharts and/or block diagrams depicting methods, systems and computer program products according to examples.

Features of various examples discussed herein may be used with other embodiments discussed herein. The foregoing description of the embodiments of the invention has been presented for the purposes of illustration and description. It is not intended to be exhaustive or to limit the invention to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes as fall within the true spirit of the invention.

We claim:

1. A method, comprising:
obtaining via an input device user defined distribution traits characterizing a random sub-space of a space of assignments for a set of generative variables;
using a processor, applying the user defined distribution traits on the space of assignments for a set of generative variables and generating the random sub-space of the space of assignments for a set of generative variables; and
testing using a testbench, a device under test using the generated random sub-space of the space of assignments for a set of generative variables.

2. The method of claim 1, wherein the user defined distribution traits comprise general user defined distribution traits and specific user defined distribution traits.

3. The method of claim 2, wherein the general user defined distribution traits comprise design parameters, constraints associated with these design parameters and relations.

4. The method of claim 2, wherein the specific user defined distribution traits comprise constraints and subgroups of parameters for exhaustive execution.

5. The method of claim 4, further comprising obtaining the specific user defined distribution traits for a regression.

6. The method of claim 1, wherein the steps of obtaining the user defined distribution traits and applying the user defined distribution traits on the space of assignments for a set of generative variables to generate the random sub-space of the space of assignments for a set of generative variables are performed as pre-test steps.

7. The method of claim 1, performed integrated in the testbench.

8. A system, comprising:
an input device to obtain user defined distribution traits characterizing a random sub-space of a space of assignments for a set of generative variables;
a processor to apply the user defined distribution traits on the space of assignments for a set of generative variables and to generate the random sub-space of the space of assignments for a set of generative variables;
a testbench to test a device under test using the generated random sub-space of the space of assignments for a set of generative variables.

9. The system of claim 8, wherein the user defined distribution traits comprise general user defined distribution traits and specific user defined distribution traits.

10. The system of claim 9, wherein the general user defined distribution traits comprise design parameters, constraints associated with these design parameters and relations.

11. The system of claim 9, wherein the specific user defined distribution traits comprise constraints and sub-groups of parameters for exhaustive execution.

12. The system of claim 11, wherein the generator is further configured to obtain the specific user defined distribution traits for a regression.

13. A non-transitory computer readable medium having instructions stored thereon, which when executed by a processor cause the processor to perform the method of:
obtaining via an input device user defined distribution traits characterizing a random sub-space of a space of assignments for a set of generative variables;
applying the user defined distribution traits on the space of assignments for a set of generative variables and generating the random sub-space of the space of assignments for a set of generative variables; and
testing using a testbench a device under test using the generated random sub-space of the space of assignments for a set of generative variables.

14. The non-transitory computer readable medium of claim 13, wherein the user defined distribution traits comprise general user defined distribution traits and specific user defined distribution traits.

15. The non-transitory computer readable medium of claim 14, wherein the general user defined distribution traits comprise design parameters, constraints associated with these design parameters and relations.

16. The non-transitory computer readable medium of claim 14, wherein the specific user defined distribution traits comprise constraints and sub-groups of parameters for exhaustive execution.

17. The non-transitory computer readable medium of claim 16, comprising further instructions that when executed by the processor cause the processor to obtain the specific user defined distribution traits for a regression.

18. The non-transitory computer readable medium of claim 13, wherein the user defined distribution traits comprise one or more sets of attributes for exhaustive testing.

19. The non-transitory computer readable medium of claim 13, wherein the user defined distribution traits comprise one or more sets of attributes for non-exhaustive testing.

20. The non-transitory computer readable medium of claim 13, wherein the user defined distribution traits comprise a repetition rule.

* * * * *